US011810768B2

(12) United States Patent
Rogers et al.

(10) Patent No.: US 11,810,768 B2
(45) Date of Patent: Nov. 7, 2023

(54) TEMPERATURE AND BIAS CONTROL OF EDGE RING

(71) Applicant: Applied Materials, Inc., Santa Clara, CA (US)

(72) Inventors: James Rogers, Los Gatos, CA (US); Linying Cui, Cupertino, CA (US); Rajinder Dhindsa, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/351,977

(22) Filed: Jun. 18, 2021

(65) Prior Publication Data

US 2021/0313156 A1    Oct. 7, 2021

Related U.S. Application Data

(63) Continuation of application No. 17/009,670, filed on Sep. 1, 2020, now Pat. No. 11,232,933, which is a (Continued)

(51) Int. Cl.
*H01J 37/32* (2006.01)
*H01L 21/67* (2006.01)
(Continued)

(52) U.S. Cl.
CPC .. *H01J 37/32642* (2013.01); *H01J 37/32724* (2013.01); *H01L 21/3065* (2013.01);
(Continued)

(58) Field of Classification Search
CPC .......... H01J 37/32642; H01J 37/32724; H01L 21/6833; H01L 21/68721
See application file for complete search history.

(56) References Cited

U.S. PATENT DOCUMENTS 6,039,836 A    3/2000  Dhindsa et al.
6,232,236 B1   5/2001  Shan et al.
(Continued)

FOREIGN PATENT DOCUMENTS

CN    106356274 A    1/2017
CN    106997842 A    8/2017
(Continued)

OTHER PUBLICATIONS

Eppler—"Controlling Uniformity at the Edge," Semiconductor Engineering webpage https://semiengineering.com/controlling-uniformity-at-the edge/, Oct. 19, 2017, 10 pages.
(Continued)

*Primary Examiner* — Binh X Tran
(74) *Attorney, Agent, or Firm* — Patterson + Sheridan, LLP

(57) ABSTRACT

Embodiments described herein provide methods and apparatus used to control a processing result profile proximate to a circumferential edge of a substrate during the plasma-assisted processing thereof. In one embodiment, a substrate support assembly features a first base plate and a second base plate circumscribing the first base plate. The first and second base plates each have one or more respective first and second cooling disposed therein. The substrate support assembly further features a substrate support disposed on and thermally coupled to the first base plate, and a biasing ring disposed on and thermally coupled to the second base plate. Here, the substrate support and the biasing ring are each formed of a dielectric material. The substrate support assembly further includes an edge ring biasing electrode embedded in the dielectric material of the biasing ring and an edge ring disposed on the biasing ring.

12 Claims, 12 Drawing Sheets

Related U.S. Application Data continuation of application No. 16/265,186, filed on Feb. 1, 2019, now Pat. No. 10,784,089.

(51) Int. Cl.
   *H01L 21/683* (2006.01)
   *H01L 21/687* (2006.01)
   *H01L 21/3065* (2006.01)

(52) U.S. Cl.
   CPC .. *H01L 21/67069* (2013.01); *H01L 21/67103* (2013.01); *H01L 21/6833* (2013.01); *H01L 21/68721* (2013.01); *H01J 2237/2001* (2013.01)

(56) References Cited

U.S. PATENT DOCUMENTS

| | | |
|---|---|---|
| 7,758,764 B2 | 7/2010 | Dhindsa et al. |
| 8,211,324 B2 | 7/2012 | Dhindsa et al. |
| 8,734,664 B2 | 5/2014 | Yang et al. |
| 8,988,848 B2 | 3/2015 | Todorow et al. |
| 9,583,357 B1 | 2/2017 | Long et al. |
| 9,601,319 B1 | 3/2017 | Bravo et al. |
| 9,620,376 B2 | 4/2017 | Kamp et al. |
| 9,761,459 B2 | 9/2017 | Long et al. |
| 9,852,889 B1 | 12/2017 | Kellogg et al. |
| 9,881,820 B2 | 1/2018 | Wong et al. |
| 2007/0032081 A1 | 2/2007 | Chang et al. |
| 2008/0236749 A1 | 10/2008 | Koshimizu et al. |
| 2009/0223810 A1 | 9/2009 | Dhindsa et al. |
| 2010/0018648 A1 | 1/2010 | Collins et al. |
| 2010/0040768 A1 | 2/2010 | Dhindsa |
| 2013/0107415 A1 | 5/2013 | Banna et al. |
| 2013/0154175 A1 | 6/2013 | Todorow et al. |
| 2013/0288483 A1 | 10/2013 | Sadjadi et al. |
| 2014/0034239 A1 | 2/2014 | Yang et al. |
| 2014/0069584 A1 | 3/2014 | Yang et al. |
| 2014/0235063 A1 | 8/2014 | McMillin et al. |
| 2014/0334060 A1 | 11/2014 | Parkhe et al. |
| 2014/0335698 A1 | 11/2014 | Singh et al. |
| 2015/0348813 A1 | 12/2015 | Mangalore et al. |
| 2016/0322242 A1 | 11/2016 | Nguyen et al. |
| 2017/0018411 A1* | 1/2017 | Sriraman .......... H01J 37/32642 |
| 2017/0053820 A1 | 2/2017 | Bosch et al. |
| 2017/0069462 A1 | 3/2017 | Kanarik et al. |
| 2017/0110335 A1 | 4/2017 | Yang et al. |
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0178917 A1 | 6/2017 | Kamp et al. |
| 2017/0200588 A1 | 7/2017 | Joubert et al. |
| 2017/0213753 A1 | 7/2017 | Rogers |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0250056 A1 | 8/2017 | Boswell et al. |
| 2017/0263478 A1 | 9/2017 | McChesney et al. |
| 2017/0316935 A1 | 11/2017 | Tan et al. |
| 2017/0330786 A1 | 11/2017 | Genetti et al. |
| 2017/0334074 A1 | 11/2017 | Genetti et al. |
| 2017/0372912 A1 | 12/2017 | Long et al. |
| 2018/0012784 A1 | 1/2018 | Eto |
| 2018/0366305 A1 | 12/2018 | Nagami et al. |
| 2019/0013184 A1 | 1/2019 | Cui et al. |
| 2019/0088523 A1 | 3/2019 | Matsuyama et al. |
| 2019/0122870 A1 | 4/2019 | Ishizawa |
| 2019/0157040 A1* | 5/2019 | Fairbairn ................ C23C 16/52 |
| 2019/0172688 A1 | 6/2019 | Ueda |
| 2019/0198298 A1* | 6/2019 | Hirose .............. H01J 37/32522 |
| 2019/0206703 A1 | 7/2019 | Zhao et al. |
| 2019/0333785 A1 | 10/2019 | Tanikawa |

FOREIGN PATENT DOCUMENTS

| | | |
|---|---|---|
| CN | 107527785 A | 12/2017 |
| CN | 206758401 U | 12/2017 |
| CN | 108206148 A | 6/2018 |
| CN | 108369922 A | 8/2018 |
| CN | 113039626 A | 6/2021 |
| JP | 2017228526 A | 12/2017 |
| JP | 2018186263 A | 11/2018 |
| KR | 20100138580 A | 12/2010 |
| WO | 2010019196 A2 | 2/2010 |

OTHER PUBLICATIONS

Hwang et al.—"Evolution of across-wafer unitormity control in plasma etch," webpage https://electroiq.com/2016/08/evolution-of-across-wafer-uniformity-control-in-plasma-etch/, Aug. 2016, 9 pages.
Wiesemann—"A Short Introduction to Plasma Physics," Lecture Notes, AEPT, Ruhr-Universitat Bochum, Germany, CERN Course on Ion Sources, Senec, Slovakia, May 2012, 38 pages.
PCT International Search Report and Written Opinion dated Apr. 29, 2020, for International Application No. PCT/US2020/012503.
Office Action for Japanese Patent Application No. 2021-544124 dated Dec. 6, 2022.
Office Action for Korean Patent Application No. 10-2021-7019894 dated Feb. 16, 2023.
Chinese Office Action and Search Report dated Aug. 10, 2023 for CN Application No. 2020800060385.3.

* cited by examiner

TEMPERATURE AND BIAS CONTROL OF EDGE RING

CROSS-REFERENCE TO RELATED APPLICATIONS

This application is a continuation of U.S. patent application Ser. No. 17/009,670, filed on Sep. 1, 2020, which is a continuation of U.S. patent application Ser. No. 16/265,186, filed on Feb. 1, 2019, now U.S. Pat. No. 10,784,089, issued on Sep. 22, 2020, both of which are herein incorporated by reference in their entireties.

BACKGROUND

Field

Embodiments described herein generally relate to semiconductor device manufacturing, and in particular, to methods and apparatus used to control a processing profile at, and proximate to, the circumferential edge of a substrate during plasma-enhanced processing thereof.

Description of the Related Art

Plasma-assisted etching processes are well known and commonly used processes of record (POR) in the manufacture of high-density integrated circuits to pattern a material layer of a substrate by forming openings thereinto. In a typical plasma-assisted etching process, a substrate is positioned on a substrate support disposed in a processing chamber, and a plasma is formed there above. Ions from the plasma are then accelerated towards the substrate, and openings formed in a mask layer disposed thereon to etch openings corresponding to the mask layer openings in the material layer disposed beneath the mask surface.

Often, the substrate support is part of a substrate support assembly which further includes an annular ring, herein an edge ring, disposed on the substrate support proximate to the circumference thereof. The edge ring circumscribes the substrate and protects the dielectric material of the substrate support from erosion otherwise caused by the plasma. Unfortunately, electrical and thermal discontinuities between the edge of the substrate and the portion of the edge ring disposed proximate thereto can cause undesirable processing result variation at the substrate edge. In a plasma-assisted etching process, undesirable processing result variation includes non-uniformity of, i.e., differences between the etched opening profile in openings at the perimeter or edge of the substrate compared to the etched profile of openings in regions of the substrate disposed radially inwardly from the substrate edge or perimeter. Excessive processing result variation across the surface of the edge of the substrate can adversely affect and suppress device yield (the percentage of devices that conform to performance specifications out of the total number of devices manufactured on the substrate).

Accordingly, there is a need in the art for apparatus and methods to control processing result variation at the edge of a substrate during plasma-assisted processing thereof.

SUMMARY

Embodiments described herein provide methods and apparatus used to control a processing result profile proximate to a circumferential edge of a substrate during the plasma-assisted processing thereof.

In one embodiment, a substrate support assembly features a first base plate and a second base plate circumscribing the first base plate. The first and second base plates each have one or more respective first and second cooling channels disposed therein. The substrate support assembly further features a substrate support disposed on and thermally coupled to the first base plate, and a biasing ring disposed on and thermally coupled to the second base plate. Here, the substrate support and the biasing ring are each formed of a dielectric material. The substrate support assembly further includes an edge ring biasing electrode embedded in the dielectric material of the biasing ring and an edge ring disposed on the biasing ring.

In another embodiment, a method of processing a substrate includes heating a substrate support of a substrate support assembly to a first temperature, heating an edge ring circumscribing the substrate support to a second temperature, and positioning a substrate on the substrate support. Here, the substrate support assembly is disposed in a processing volume of a processing chamber and features a first base plate and a second base plate circumscribing the first base plate. The first and second base plates each have one or more respective first and second cooling channels disposed therein. The substrate support assembly further includes the substrate support disposed on and thermally coupled to the first base plate, and a biasing ring disposed on and thermally coupled to the second base plate. The substrate support and the biasing ring are each formed of a dielectric material. The substrate support assembly further includes an edge ring biasing electrode embedded in the dielectric material of the biasing ring and the edge ring disposed on the biasing ring. The method further includes flowing a processing gas into the processing volume, igniting and maintaining a plasma of the processing gas, biasing the substrate using a first bias voltage, and biasing the edge ring using a second bias voltage.

In another embodiment, a processing chamber includes a substrate support assembly disposed in a processing volume of the processing chamber and a computer-readable medium having instructions stored thereon for performing a method of processing a substrate when executed by a processor. Here, the substrate support assembly includes a first base plate and a second base plate circumscribing the first base plate. The first and second base plates each have one or more respective first and second cooling channels disposed therein. The substrate support assembly further includes a substrate support disposed on and thermally coupled to the first base plate, and a biasing ring disposed on and thermally coupled to the second base plate. Here, the substrate support and the biasing ring are each formed of a dielectric material. The substrate support assembly further includes an edge ring biasing electrode embedded in the dielectric material of the biasing ring and an edge ring disposed on the biasing ring. The method of processing the substrate includes heating the substrate support to a first temperature, heating the edge ring circumscribing the substrate to a second temperature, and positioning a substrate on the substrate support. The method further includes flowing a processing gas into the processing volume, igniting and maintaining a plasma of the processing gas, biasing the substrate using a first bias voltage, and biasing the edge ring using a second bias voltage.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
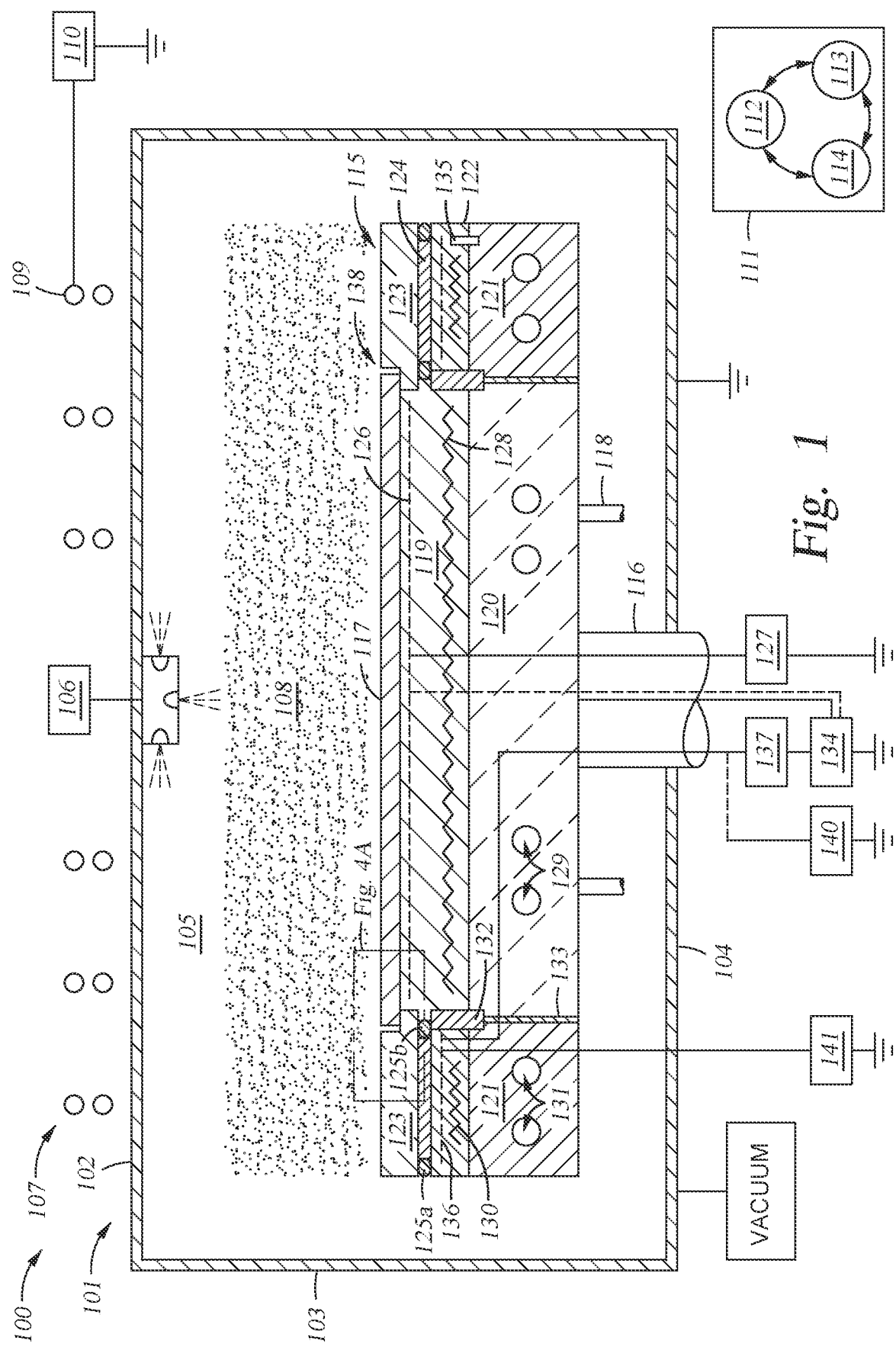
FIG. 1 is a schematic cross-sectional view of a processing chamber featuring a substrate support assembly configured to practice the methods set forth herein, according to one embodiment.

To facilitate understanding, identical reference numerals have been used, where possible, to designate identical elements that are common to the figures. It is contemplated that elements and features disclosed in one embodiment may be beneficially incorporated in other embodiments without specific recitation thereof.

DETAILED DESCRIPTION

Embodiments described herein provide methods and apparatus used to control a processing result profile proximate to a circumferential edge of a substrate during the plasma-assisted processing thereof. In particular, the methods and apparatus herein provide for selective electrical biasing and for temperature control of an annular ring, herein an edge ring circumferentially disposed about the surface of the substrate support assembly on which a to be processed substrate will be supported. The biasing and temperature control of the edge ring is independent of the biasing and temperature control of a substrate support having the to be processed substrate disposed thereon.

Independent biasing and temperature control between the substrate support and the edge ring enables fine tuning of the processing result profile proximate to the edge of the substrate. For example, in a plasma-assisted etching process, the processing results on the substrate proximate to the substrate edge, e.g., within 15 mm of the edge, often deviate from the processing results on the substrate at locations radially inward from the substrate edge. This processing result non-uniformity is often attributable to corresponding discontinuities or changes in the properties of a plasma used to perform a process on the substrate which is formed over the substrate, here where the plane of the major surface of the substrate is processed in a horizontal position. Discontinuities or changes in the properties of the processing plasma include changes in the shape of the plasma region over the substrate and changes in the degree of ionization of processing gases forming the plasma across the plasma. Typically, these discontinuities or changes in the processing plasma are more pronounced in regions disposed above the edge region of the substrate and the edge ring proximate thereto, as compared to regions over the substrate and inwardly of the edge of the substrate. Therefore, the apparatus and methods provided herein enable fine control of both edge ring biasing and edge ring temperature to ameliorate these differences.

Often previous substrate processing operations, such as material deposition operations, e.g., CVD, PVD, and ALD processes, or material removal operations, e.g., chemical mechanical polishing (CMP) and wet or dry etching processing, may cause a feature profile deviation or material thickness deviation between the center region and the edge regions of the substrate. In such circumstances, the fine control of both edge ring biasing and edge ring temperature enabled by embodiments described herein may be used to compensate for the center-to-edge non-uniformities from the previous substrate processing operations.

Edge ring biasing facilitates tuning the shape of the plasma in regions disposed above and proximate to the substrate edge by controlling the shape of a plasma sheath, as shown and described in FIGS. 1 and 4A-4C. Where the plasma sheath curves, the trajectories of ions pulled towards the biased substrate are different than the trajectories of ions pulled towards the substrate from a plasma when the sheath is parallel to the substrate surface. Controlling the edge ring temperature affects the concentration of reactive neutral species, e.g., radicals and activated molecules, in the processing gases, and thus tunes the chemical reactions involving the reactive neutrals in regions disposed above and proximate to the substrate edge.

FIG. 1 is a schematic cross-sectional view of a plasma processing chamber configured to practice the methods set forth herein, according to one embodiment. In this embodiment, the processing chamber is a plasma etch processing chamber, such as a reactive ion etch (RIE) plasma chamber. In other embodiments, the processing chamber is a plasma-enhanced deposition chamber, for example, a plasma-enhanced chemical vapor deposition (PECVD) chamber, a plasma-enhanced physical vapor deposition (PEPVD) chamber, or a plasma-enhanced atomic layer deposition (PEALD) chamber. In other embodiments, the processing chamber is a plasma treatment chamber or a plasma-based ion implant chamber, for example, a plasma doping (PLAD) chamber or a physical vapor deposition (PVD) chamber. Herein, the processing chamber includes an inductively coupled plasma (ICP) source electrically coupled to a radio frequency (RF) power supply. In other embodiments, the plasma source is a capacitively coupled plasma (CCP) source, such as a plasma electrode disposed in the processing volume where the plasma electrode is electrically coupled to an RF power supply and capacitively couples energy and power into the plasma in the chamber.

The processing chamber 100 features a chamber body 101, including a chamber lid 102, one or more sidewalls 103, and a chamber base 104, which collectivity define a processing volume 105. The processing volume 105 is fluidly coupled to a processing gas source 106, which delivers processing gases thereinto. The processing chamber 100 further includes a plasma generator 107 configured to ignite and maintain a plasma 108 of the processing gas(es) introduced into the processing volume through the processing gas source. The plasma generator 107 includes one or more inductive coils 109 disposed proximate to the chamber lid 102 at a location outside of the processing volume 105. The one or more inductive coils 109 are electrically coupled to an RF power supply 110. The plasma generator 107 is used to ignite and maintain the plasma 108 by inductively coupling energy from the inductive coils 109 powered by the RF power supply 110 into the processing gas(es). Here, the processing volume 105 is fluidly coupled to a vacuum source, such as one or more dedicated vacuum pumps to maintain the processing volume 105 at sub-atmospheric pressure and evacuate processing, and other gases, therefrom. Typically, the processing chamber includes a system controller 111, which is used to control the operation of the processing chamber and implement the methods set forth herein.

Herein, the system controller 111 includes a programmable central processing unit, herein the CPU 112, that is operable with a memory 113 (e.g., non-volatile memory) and support circuits 114. The support circuits 114 are conventionally coupled to the CPU 112 and comprise cache, clock circuits, input/output subsystems, power supplies, and the like, and combinations thereof coupled to the various components of the processing chamber 100, to facilitate control thereof. The CPU 112 is one of any form of general purpose computer processor used in an industrial setting, such as a programmable logic controller (PLC), for controlling various components and sub-processors of the processing chamber 100. The memory 113, coupled to the CPU 112, is non-transitory and is typically one or more of readily available memories such as random access memory (RAM), read only memory (ROM), floppy disk drive, hard disk, or any other form of digital storage, local or remote.

Typically, the memory 113 is in the form of a computer-readable storage media containing instructions (e.g., non-volatile memory), that when executed by the CPU 112, facilitates the operation of the processing chamber 100. The instructions in the memory 113 are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the methods described herein, or portions thereof, are performed by one or more application specific integrated circuits (ASICs), field-programmable gate arrays (FPGAs), or other types of hardware implementations. In some other embodiments, the processes described herein are performed by a combination of software routines, ASIC(s), FPGAs and, or, other types of hardware implementations.

The processing chamber 100 further includes a substrate support assembly 115 disposed in the processing volume 105. The substrate support assembly 115 is disposed on a support shaft 116 sealingly extending through the chamber base 104, such as being surrounded by a bellows (not shown) in a region below the chamber base 104 or in a region disposed between the substrate support assembly 115 and the chamber base 104. Typically, a substrate 117 is loaded into the processing volume 105 through an opening (not shown) in one of the one or more sidewalls 103, which is conventionally sealed with a door or a valve (not shown) during substrate processing. Transferring of the substrate 117 to and from the substrate support assembly 115 is facilitated by a plurality of lift pins 118 movably disposed therethrough. In a raised position, the lift pins 118 extend above a surface of the substrate support assembly 115, lifting the substrate 117 therefrom and enabling access to the substrate 117 by a robot handler (not shown). In a lowered position, the upper surfaces (not shown) of the lift pins 118 are flush with, or disposed below, the surface of the substrate support assembly 115, and the substrate 117 rests thereon.

Here, the substrate support assembly 115 includes a substrate support 119 disposed on, and thermally coupled to, a first base plate 120, and a second base plate 121 circumscribing the first base plate 120. The substrate support 119 is formed from a dielectric material, such as a bulk sintered ceramic material, such as silicon carbide (SiC) or a metal oxide or metal nitride ceramic material, for example, aluminum oxide ($Al_2O_3$), aluminum nitride (AlN), titanium oxide (TiO), titanium nitride (TiN), yttrium oxide ($Y_2O_3$), mixtures thereof, and combinations thereof. The substrate support 119 is thermally coupled to the first base plate 120 by a thermally conductive adhesive or by mechanical means, including a thermally conductive material, such as a thermally conductive and physically conforming gasket or other conductive material, disposed between the first base plate 120 and the substrate support 119. In some embodiments, one or both of the first base plate 120 and the second base plate 121 are formed of a corrosion-resistant thermally conductive material, such as a corrosion-resistant ceramic or metal, for example aluminum, an aluminum alloy, stainless steel, or aluminum nitride (AlN).

The substrate support assembly 115 further includes a biasing ring 122 disposed on the second base plate 121 and an edge ring 123 disposed over the biasing ring 122. The biasing ring 122 is typically made of a dielectric material having an electrode embedded therein. The dielectric material can be one or a combination of the ceramic materials which may be used to form the substrate support 119 as set forth above. Typically, the edge ring 123 is formed of a thermally and electrically conductive material, such as silicon, graphite, silicon carbide, or a combination thereof. In some embodiments, the edge ring 123 is thermally coupled to the biasing ring 122 by a thermally conductive material 124, such as a silicone gasket, interposed therebetween. In other embodiments, the thermally conductive material 124 comprises a silicone or acrylic based tape or paste.

In some embodiments, protective rings 125a-b are disposed between the edge ring 123 and the biasing ring 122 and on the inner and outer circumferential sides of the thermally conductive material 124, to protect the thermally conductive material 124 from processing gas and plasma caused corrosion by preventing exposure thereto. The first protective ring 125a circumscribes the thermally conductive material 124 and is thus disposed proximate to and radially outward therefrom. The second protective ring 125b is disposed radially inward of the thermally conductive material 124 and proximate thereto. Here, the protective rings 125a-b are formed of a processing gas and plasma resistant polymer. Examples of suitable polymers include one or more fluorine-containing polymers (fluoropolymer), such as perfluoroalkoxy (PFA), fluorinated ethylene propylene (FEP), polytetrafluoroethylene (PTFE) commercially available as TEFLON® from DuPont, or combinations thereof.

In other embodiments, the edge ring 123 is disposed directly on the biasing ring 122 and is in direct contact therewith. Typically, in those embodiments, the interfacial surfaces of one or both of the edge ring 123 and the biasing ring 122 are polished during the manufacturing thereof. The polished interfacial surfaces of the edge ring 123 and the biasing ring 122 result in increased surface contact area relative to unpolished surfaces and thus desirably increased heat transfer rates therebetween. In some embodiments, the a DC power supply 141 is electrically coupled to an electrode embedded in the biasing ring 122, such as the edge ring biasing electrode 136 or a second electrode (not shown). In those embodiments, the edge ring biasing electrode 136 or the second electrode is used to ensure close contact and thus high thermal transfer rate between the biasing ring 122 and the edge ring 123 by providing a potential between the edge ring 123 and the edge ring biasing electrode or the second electrode which results in an electrostatic (ESC) attraction force therebetween.

Here, the substrate support 119 includes one or more chucking electrodes 126 embedded in a dielectric material thereof. The one or more chucking electrodes 126 are used to secure the substrate 117 to the substrate support 119 by providing a potential between the substrate 117 and the chucking electrode(s) 126 which results in an electrostatic (ESC) attraction force therebetween. Here, the one or more chucking electrodes 126 are coupled to a chucking power source 127, such as a DC power supply, which provides a chucking voltage thereto.

The substrate support assembly 115 is further configured to bias one or both the edge ring 123 and the substrate 117 with respect to the plasma 108 formed there above. Typically, the substrate 117 is biased through capacitive coupling with an electrode having a substrate biasing voltage applied thereto. The electrode used to provide the bias may be disposed in or beneath the dielectric material of the substrate support 119. In some embodiments, biasing the substrate 117 comprises applying a substrate biasing voltage to the chucking electrode 126 disposed in the dielectric material of the substrate support 119. In those embodiments, the chucking electrode 126 is electrically coupled to both the chucking power source 127 and the biasing power source 134 (electrical coupling between the biasing power source 134 and the chucking electrode 126 is shown in phantom). In those embodiments, the chucking electrode 126 is used to provide both the substrate bias and the DC chucking potential. In some embodiments, biasing the substrate 117 includes applying a substrate biasing voltage from a biasing power source 134 to the first base plate 120, which is electrically coupled to the biasing power source 134. In other embodiments, biasing the substrate 117 comprises applying a biasing voltage to a substrate biasing electrode (not shown) embedded in the dielectric material of the substrate support 119. When used, a substrate biasing electrode is typically electrically isolated from the chucking electrode 126 by dielectric material of the substrate support 119 disposed therebetween. Typically, the biasing power source 134 provides one or a combination of continuous wave (CW) RF power, pulsed RF power, CW DC power, or pulsed DC power.

Biasing the edge ring 123, independently of biasing the substrate 117, includes applying an edge ring biasing voltage to an edge ring biasing electrode 136. Here, the edge ring biasing electrode 136 is embedded in the dielectric material of the biasing ring 122 and is electrically coupled to the biasing power source 134 through a tuning circuit 137 disposed therebetween. In other embodiments, the edge ring biasing electrode 136 is electrically coupled to a second biasing power source 140 which is different from the biasing power source 134 (electrical coupling between the edge ring biasing electrode 136 and the second biasing power source 140 is shown in phantom). Independent biasing of the edge ring 123 and the substrate 117 allows fine control of the shape of a plasma sheath 138a proximate to the circumferential edge of the substrate 117. The plasma sheath 138a typically defines a dark-space boundary region disposed between the bulk of the plasma 108 and the surfaces of the substrate 117 and the edge ring 123 facing the plasma 108. Controlling the shape of the plasma sheath 138a is further discussed in the description set forth with respect to FIGS. 4A-4C below.

In some embodiments, one or both of the first base plate 120 and the second base plate 121 are formed of a thermally conductive electrically insulating material, such as metal nitride ceramic material, for example aluminum nitride (AlN). Forming one or both of the first and second base plates 120 and 121 of a thermally conductive electrically insulating material desirably prevents or substantially eliminates cross-talk between the edge ring biasing electrode 136 and an electrode used to provide a biasing power the substrate, e.g., a substrate biasing electrode (described above but not shown) or the chucking electrode 126 when the biasing power source 134 is electrically coupled thereto. "Cross-talk" as used herein is the undesirable electrical interference between the powers provided to each of the electrodes which may undesirably interfere with the ability to independently control the biasing powers thereto. Typically, cross-talk results from the capacitive coupling of electrodes and an otherwise electrically conductive base plate or base plates, e.g., aluminum base plates, through the relatively thin dielectric materials of the substrate support or biasing ring disposed therebetween.

Here, the substrate support assembly 115 further includes one or more first heating elements 128 embedded in the dielectric material of the substrate support 119 and one or more first cooling channels 129 disposed in the first base plate 120. The one or more first heating elements 128 are used to heat the substrate support 119, and thus the substrate 117 disposed thereon, to a desired temperature before processing and to maintain the substrate 117 at a desired temperature during processing. The one or more first cooling channels 129 are fluidly coupled to, and in fluid communication with, a coolant source (not shown), such as a refrigerant source or modified water source having a relativity high electrical resistance. The first base plate 120 is used to regulate the temperature of the substrate support 119, and thus the temperature of a substrate 117 disposed on the substrate support 119, during substrate processing. The first heating element(s) 128 and the coolant flow through the first cooling channels 129 may be used alone or in combination to facilitate fine control of the temperature of the substrate support 119 and thus fine control of the temperature of the substrate 117 disposed thereon.

The temperature of the edge ring 123 is maintained and controlled independently of the temperature of the substrate 117 using one or both of a second heating element 130 and a second cooling channel 131. In this embodiment, the second heating element 130 comprises a resistive heating element embedded in the dielectric material of the biasing ring 122. The second heating element 130 is used to heat the biasing ring 122, and thus heat the edge ring 123 thermally coupled to the biasing ring 122, to a desired temperature before substrate processing and, in combination with a coolant flowing through the second cooling channel 131, to maintain the edge ring at a desired temperature during substrate processing. Here, the biasing ring 122 is thermally insulated from the substrate support 119 by a first insulator ring 132 interposed therebetween.

Here, the second cooling channel 131, disposed in the second base plate 121, is fluidly coupled to and in fluid communication with a coolant source (not shown) which may be the same as or different from the coolant source used to deliver cooling fluid to the first cooling channel(s). In embodiments where the same coolant source is used, the coolant flowrate through the first and second cooling channels is independently controlled to facilitate independent temperature control of the first and second base plates 120, 121 respectively. Typically, the second base plate 121 is thermally isolated from the first base plate 120 by a second insulator ring 133 interposed therebetween. The first and second insulator rings 132, 133 are typically formed of a material suitable for inhibiting heat transfer between the substrate support 119 and the biasing ring 122 and between the first and second base plates 120 and 121 respectively. Examples of suitable materials which may be used for the thermal insulator rings 132, 133 include PTFE, quartz, silicone, and combinations thereof. In some embodiments, a thermal insulator ring is not used and the first base plate and the second base plate are spaced apart and thermally isolated from one another by a vacuum provided in the space therebetween.

Figure 2A:
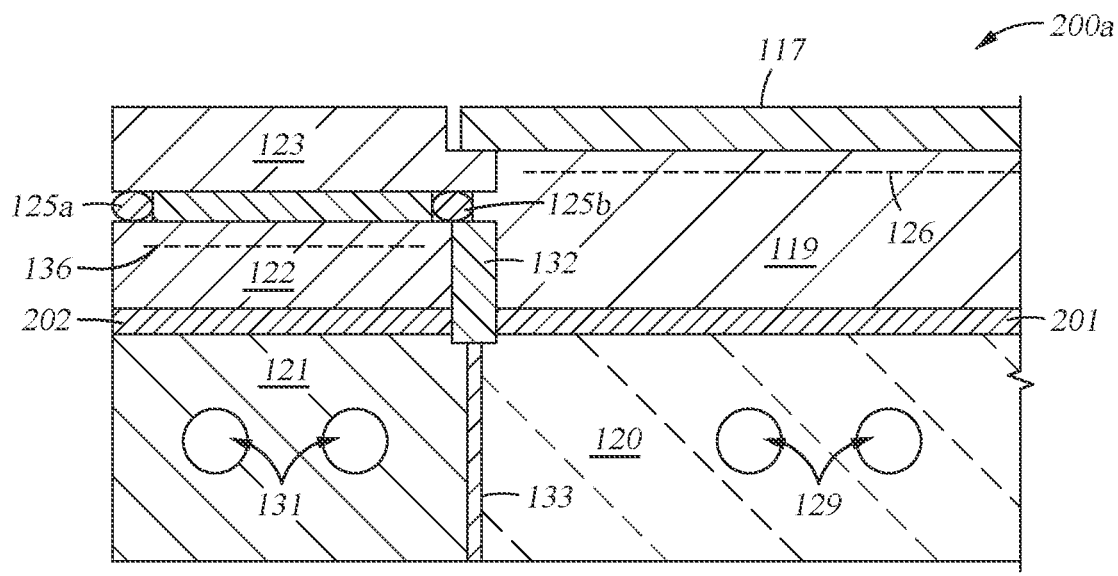
FIG. 2A-2C are schematic cross-sectional views of a portion of a substrate support assembly, according to other embodiments, which may be used in the plasma processing chamber described in FIG. 1.

Here, the substrate support assembly 115 further includes one or more temperature sensors, such as the thermocouple 135, disposed in or proximate to dielectric material of the biasing ring 122. The thermocouple 135 is used to monitor the temperature of the biasing ring 122 and thus the temperature of the edge ring 123 thermally coupled thereto. In some other embodiments, one or both of the substrate support 119 and the edge ring 123 are heated using a dedicated heater therefore disposed there beneath, such as shown in FIG. 2A. In some other embodiments, both the substrate support 119 and the edge ring 123 are disposed on a common baseplate, such as shown in FIG. 3.

FIG. 2A is a schematic cross-sectional view of a portion of a substrate support assembly 200a, according to one embodiment, which may be used in place of the substrate support assembly 115 in the processing chamber 100 described in FIG. 1. Here, a first heater, such as the first heating plate 201 is interposed between the substrate support 119 and the first base plate 120 and a second heater, such as the second heating plate 202, is interposed between the biasing ring 122 and the second base plate 121. The first heating plate 201 is thermally isolated from the second heating plate 202 by the first insulator ring 132 disposed therebetween. The second base plate 121 is thermally isolated from the first base plate 120 by a second insulator ring 133 interposed therebetween.

Figure 2B:
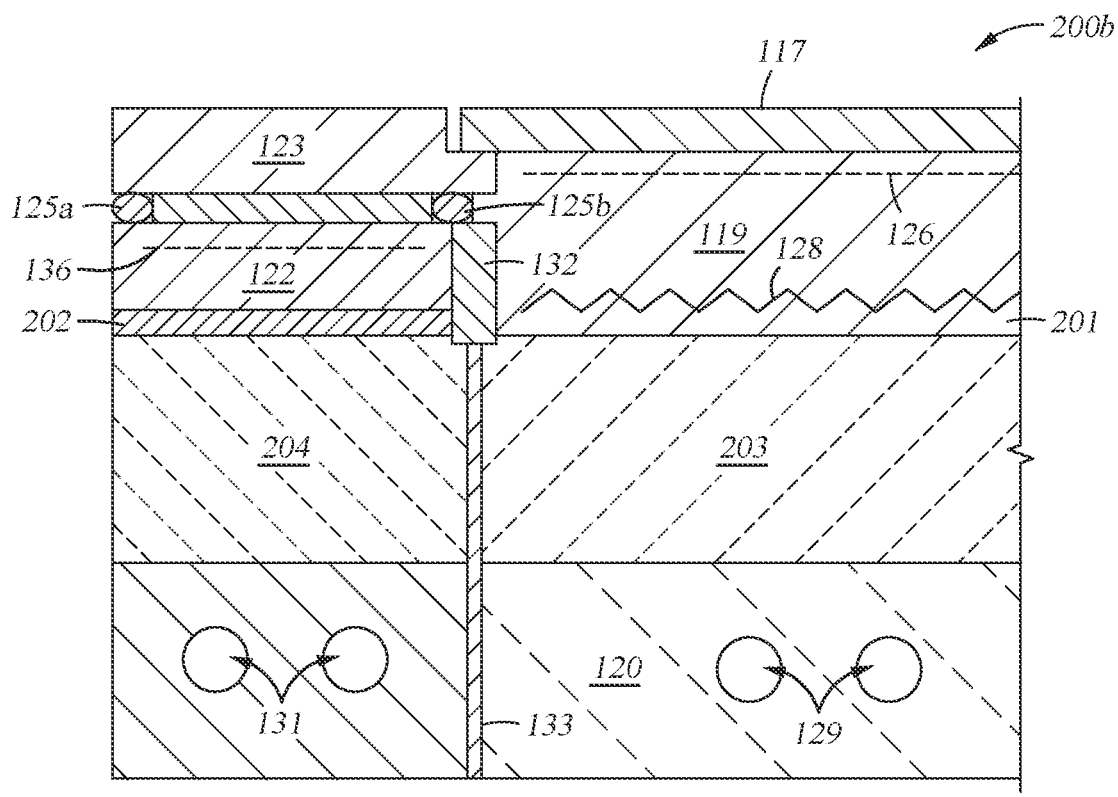

FIG. 2B is a schematic cross-sectional view of a portion of a substrate support assembly 200b, according to one embodiment, which may be used in place of the substrate support assembly 115 in the processing chamber 100 described in FIG. 1. Here, the substrate support assembly 200a is similar to the substrate support assembly 115 described in FIG. 1 and further includes a first electrically insulating plate 203 and a second electrically insulating plate 204. The first electrically insulating plate 203 is interposed between the substrate support 119 and the first base plate 120. The second electrically insulating plate 204 is interposed between the biasing ring 122 and the second base plate 121. Here, the second electrically insulating plate 204 circumscribes the first electrically insulating plate 203 and is thermally isolated therefrom by one or both of the first insulator ring 132 and the second insulator ring 133 interposed therebetween.

Typically, one or both of the first and second electrically insulating plates 203 and 204 are formed of a thermally conductive electrically insulating material, such as metal nitride ceramic material, for example, aluminum nitride (AlN). The electrically insulating plates 203 and 204 desirably prevent or substantially eliminate cross-talk between the edge ring biasing electrode 136 and an electrode used to provide a biasing power to the substrate, e.g., a substrate biasing electrode (described above but not shown) or the chucking electrode 126 when the biasing power source 134 is electrically coupled thereto. In some embodiments, one or both of the electrically insulating plates 203 and 204 have a thickness sufficient to substantially eliminate or significantly reduce capacitive coupling of the respective electrodes disposed there above with the respective base plates disposed there below. For example, in some embodiments, one or both of the electrically insulating plates 203 and 204 have a thickness of more than about 5 mm, such as more than about 10 mm, or for example, between about 5 mm and about 50 mm.

Figure 2C:
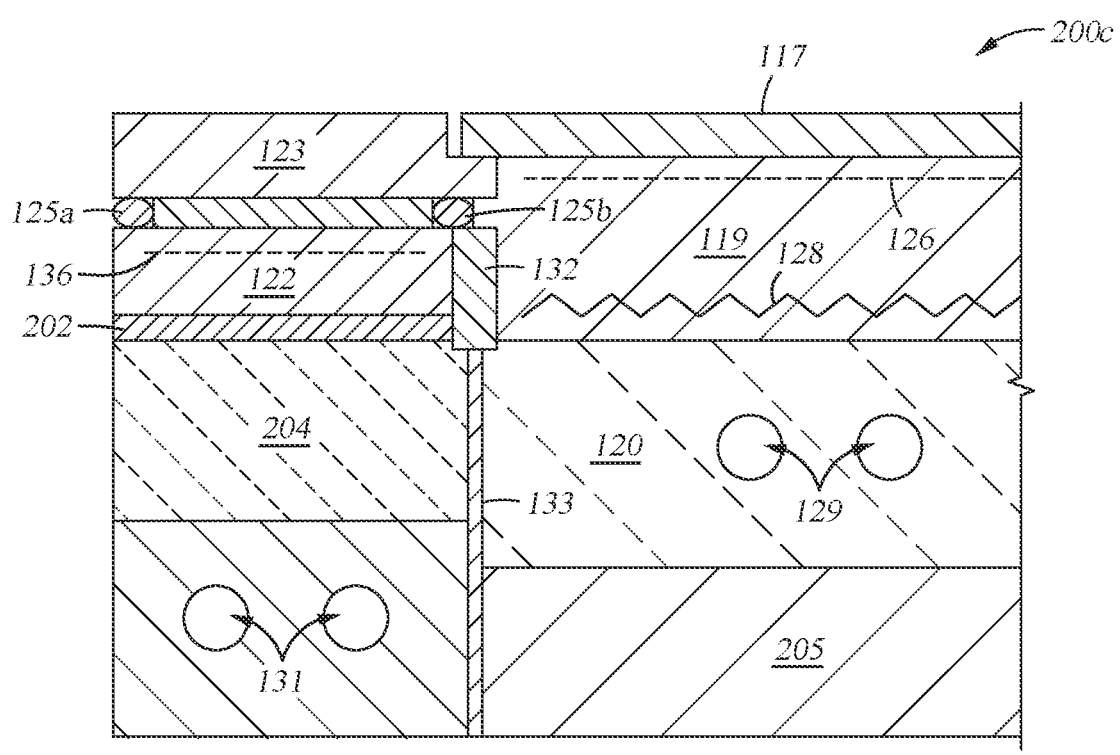

FIG. 2C is a schematic cross-sectional view of a portion of a substrate support assembly 200c, according to one embodiment, which may be used in place of the substrate support assembly 115 in the processing chamber 100 described in FIG. 1. Here, the substrate support assembly 200c is similar to the substrate support assembly 115 described in FIG. 1 and further includes an electrically insulating plate 204 interposed between the second base plate 121 and the biasing ring 122. The substrate support assembly 200c does not include the electrically insulating plate 203 described in FIG. 2B, and the first base plate 120 is supported by at least a portion of a facility plate 205. The facility plate 205 provides structural support to the substrate support assembly 200c and may be used with one or any combination of embodiments described herein. In other embodiments, the substrate support assembly may include the electrically insulating plate 203 and not include the electrically insulating plate 204. Including one of the electrically insulating plates and not the other reduces the manufacturing costs of the substrate support assembly while still reducing or substantially eliminating the cross-talk between biasing electrodes.

Figure 3A:
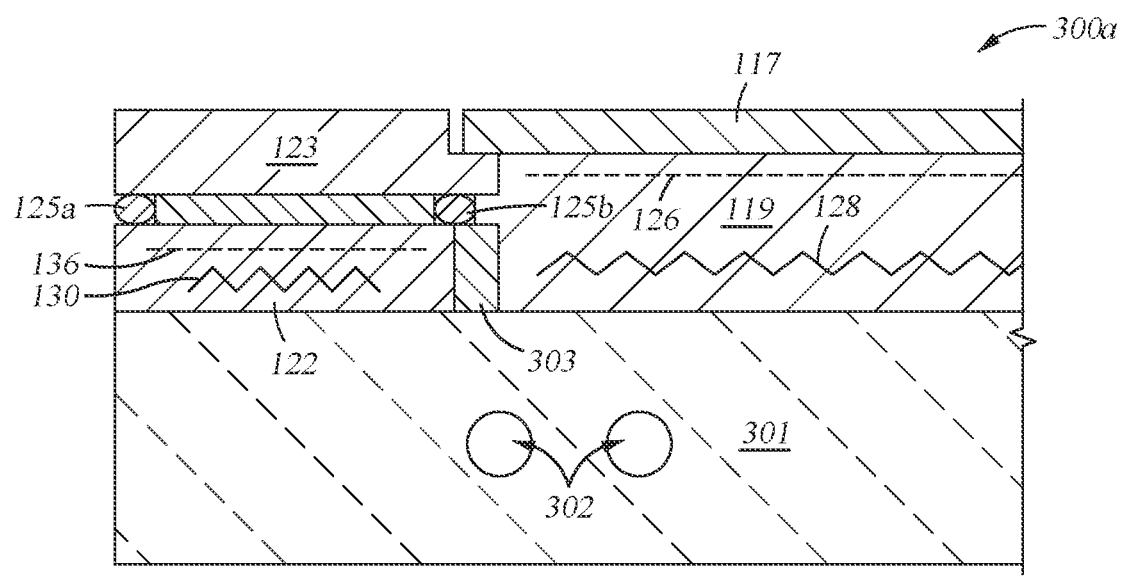
FIG. 3A-3B are schematic cross-sectional views of a portion of a substrate support assembly, according to other embodiments, which may be used in the processing chamber described in FIG. 1.

FIG. 3A is a schematic cross-sectional view of a portion of a substrate support assembly 300b, according to another embodiment, which may be used in place of the substrate support assembly 115 in the processing chamber 100 described in FIG. 1. Here, both the substrate support 119 and the biasing ring 122 are disposed on a common base plate 301. The temperature of the base plate 301 is regulated using one or more cooling channels 302 disposed therein. The one or more cooling channels 302 are fluidly coupled to, and in fluid communication with, a coolant source (not shown), such as a refrigerant source or modified water source having a relativity high electrical resistance. The base plate 301 is used to regulate the temperature of the substrate support 119 and the biasing ring 122, and thus the temperature of a substrate 117 and an edge ring 123 respectively disposed on the substrate support 119 and the biasing ring 122, during substrate processing. Here, the substrate support 119 and the biasing ring 122 are thermally insulated from each other by an insulator ring 303 interposed therebetween. In this embodiment, each of the substrate support 119 and the biasing ring 122 include a respective heating element 128, 130 embedded in the dielectric material thereof. In other embodiments, the substrate support 119 and the biasing ring 122 are heated using heating plates, such as the heating plates 201, 202 shown in FIG. 2.

Typically, the biasing ring 122, and thus the edge ring 123 disposed thereon, is maintained at a desired temperature or within a desired range of temperatures using measurements provided by the one or more thermocouples 135. The measured temperature(s) are communicated to the system controller 111 which compares the measured temperature(s) to a desired temperature set point or a desired temperature range. If the measured temperature falls below the desired temperature set point or below the desired temperature range the system controller 111 will increase heat flow into the edge ring 123. Typically, heat flow to the edge ring 123 is increased by applying, or increasing, a power provided to a second heating element 130, shown in FIGS. 1 and 3, or to a second heating plate 202, shown in FIG. 2. If the measured temperature rises above the desired temperature set point or above the desired temperature range, the system controller 111 will remove heat from the edge ring 123. Typically, heat is removed from the edge ring 123 by turning off or lowering the power applied to the biasing ring 122, changing the coolant flow rate to the second base plate 121, shown in FIGS. 1 and 2, or the combined base plate, shown in FIG. 3A, or a combination thereof. In some embodiments, the substrate support assembly 300a further includes one or both of the first electrically insulating plate 203 and the second electrically insulating plate 204 (shown in FIG. 2B) respectively interposed between the base plate 301 and the substrate support 119 or the base plate 301 the biasing ring 122.

Figure 3B:
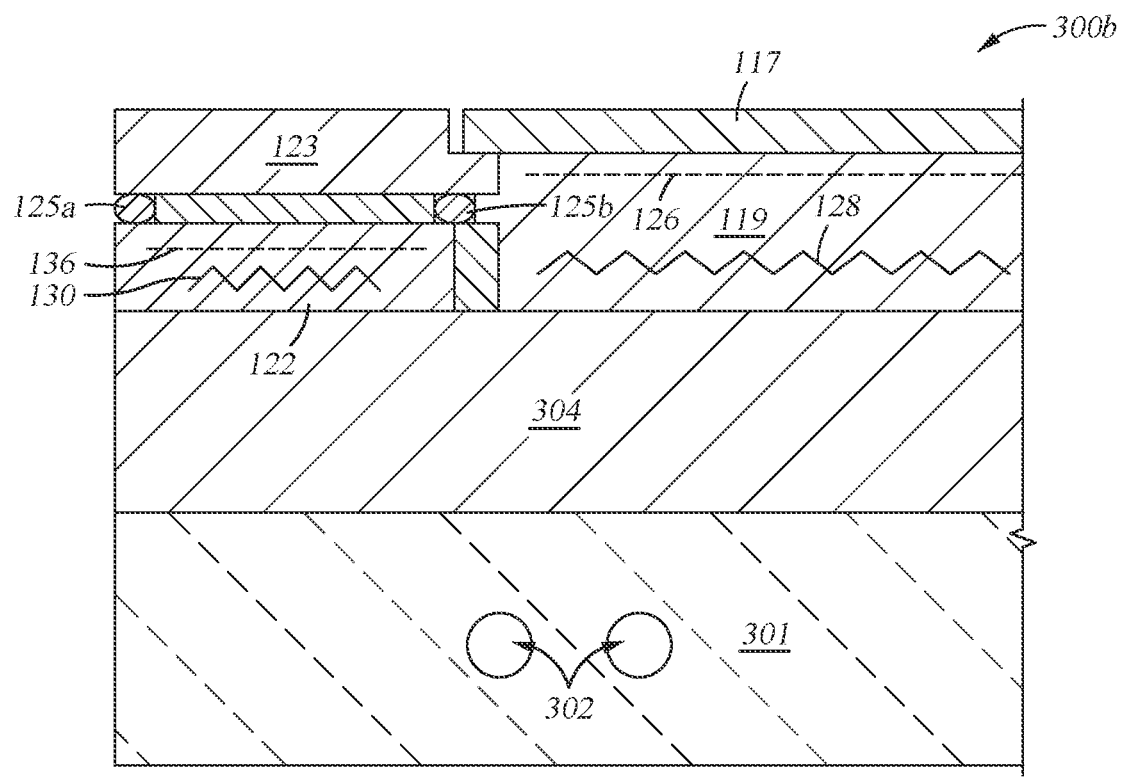

FIG. 3B is a schematic cross-sectional view of a portion of a substrate support assembly 300b, according to one embodiment, which may be used in place of the substrate support assembly 115 in the processing chamber 100 described in FIG. 1. Here, the substrate support assembly 300b further includes a common electrically insulating plate 304 interposed between the common base plate 301 and the substrate support 119 and biasing ring 122. The electrically insulating plate 304 may be formed of the same material and have the same thickness as described above with respect to the first and second electrically insulating plates 203 and 204.

Figure 4A:
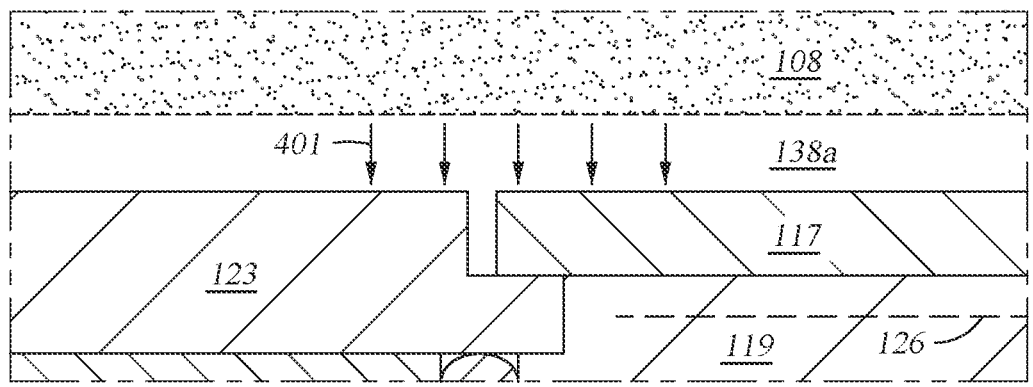
FIGS. 4A-4C are close-up views of a portion of FIG. 1 schematically illustrating various plasma sheath profiles formed using the methods set forth herein.
Figure 4B:
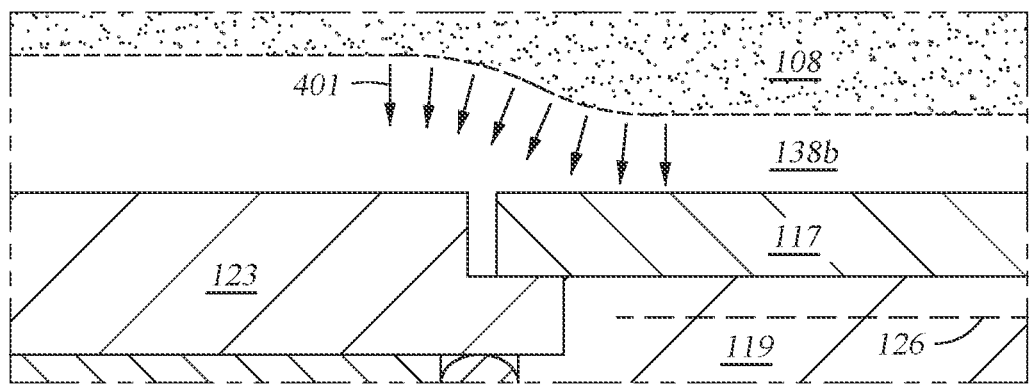
Figure 4C:
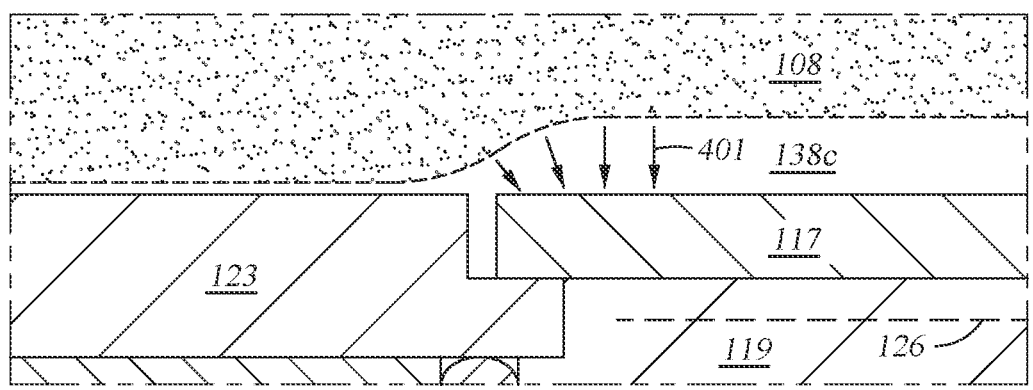

FIGS. 4A-4C are schematic cross-sectional views of a portion of the processing chamber 100 shown in FIG. 1 respectively illustrating various shapes of plasma sheaths 138a-c proximate to the edge of the substrate 117. Herein, the shapes of the plasma sheaths 138a-c are controlled by adjusting the ratio of biasing voltages applied to the substrate 117, and to the edge ring 123, using the methods set forth herein. Typically, increasing the bias voltage provided to the edge ring 123 results in relatively thicker plasma sheath 138b above the edge ring 123 when compared to an edge ring 123 having a lower, or no, bias voltage applied thereto.

In FIG. 4A the plasma sheath 138a has a uniform thickness across a region disposed above the substrate 117 and a region disposed above a portion of the edge ring 123 proximate to the substrate 117. The uniform thickness of the plasma sheath 138a facilitates the acceleration of ions from the plasma 108 towards the surface of the substrate 117 in a trajectory 401, which is substantially uniform and orthogonal to the surface of the substrate 117 proximate to the edge thereof.

In FIG. 4B the plasma sheath 138b is thicker in the region disposed above the edge ring 123 than in the region disposed above the substrate 117. As shown in FIG. 4B, the plasma sheath 138b bends away from the edge of the substrate 117 in the region disposed there above. Here, the trajectory 401 of ions from the plasma 108 to the edge of the substrate 117 disposed there below is angled towards the edge ring 123. Thus, the ion trajectory 401 proximate to the edge of the substrate in FIG. 4B is less focused than in FIGS. 4A and 4C, and the etch rate at proximate to the edge of the substrate is comparatively reduced.

In FIG. 4C, the plasma sheath 138c is thinner in the region disposed above the edge ring 123 than in the region disposed above the substrate 117. As shown in FIG. 4C, the plasma sheath bends towards the edge of the substrate 117 in the region disposed there above. Here, the trajectory 401 of ions from the plasma 108 towards the substrate 117 is angled away from the edge ring 123 around the circumference of the substrate 117. Thus, the ion trajectory 401 proximate to the edge of the substrate in FIG. 4C is more focused than in FIGS. 4A and 4B and the concentration of ions bombarding the substrate, and thus the etch rate, proximate to the edge of the substrate is comparatively increased. By reducing or increasing the focus of the ion trajectory 401 proximate to the edge of the substrate 117, the etch rate can be tuned to be respectively slower or faster at the edge when compared to the rest of the substrate disposed radially inward therefrom.

In addition to increasing or decreasing the focus of ions bombarding the substrate surface proximate to the substrate edge, tuning the curvature of the plasma sheath changes the directionality of the openings etched in the material layer(s) thereof. For example, in FIG. 4A the trajectories 401 of ions striking the substrate surface proximate to the edge of the substrate are substantially perpendicular thereto, and the openings (not shown) formed therefrom will be substantially perpendicular to the substrate surface. In FIGS. 4B and 4C, the trajectories 401 of ions are respectively angled away from or towards the center of the substrate 117 and the resulting openings formed therefrom will be angled accordingly. Thus the angle of the etched openings can be tuned by the edge ring bias power in order to compensate the effects where other chamber components result in feature tilting on the edge of the substrate, such as non-uniform plasma distribution due to plasma source or bias, or edge ring thinning over the useful production lifetime of the substrate support.

Figure 4D:
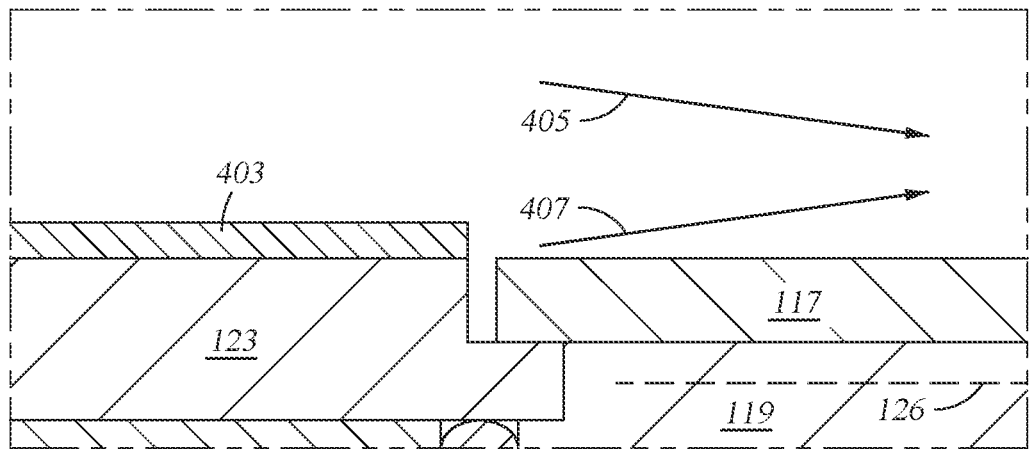
FIGS. 4D-4E are close-up views of a portion of FIG. 1 schematically illustrating the effect of various edge ring temperatures using the methods set forth herein.
Figure 4E:
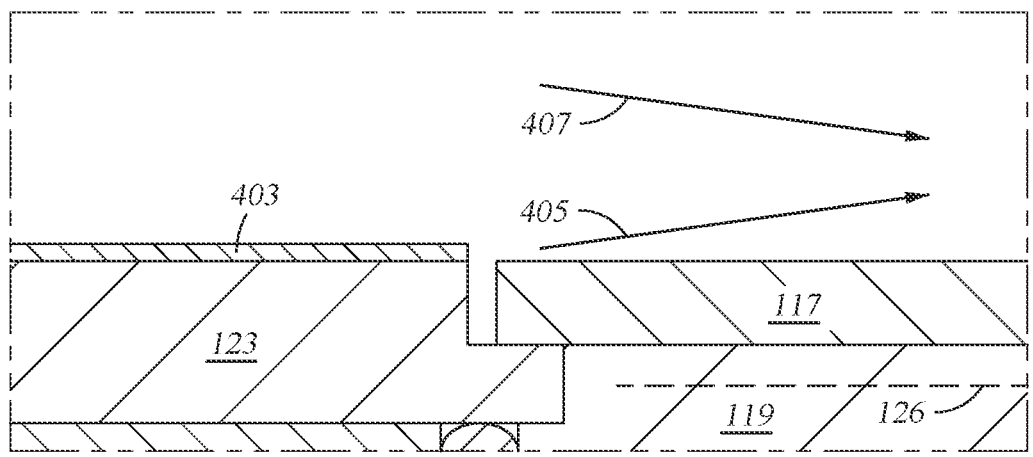

FIGS. 4D and 4E schematically illustrate the effect of the edge ring temperature on the neutral reactive species concentration above and proximate to the edge of the substrate. Here, the edge ring 123 in FIG. 4D is maintained at a lower temperature than the edge ring 123 in FIG. 4E. The etch rate profile and polymer deposition profile from locations at the edge of the substrate to locations disposed radially inward therefrom are schematically represented by arrows 405 and 407, respectively. When the edge ring temperature is relatively low (FIG. 4D), more polymerizing species 403 tend to deposit on the edge ring 123, resulting in lower concentration of polymerizing species above the edge ring 123 and near the substrate edge. Thus, comparatively less polymer deposits on the substrate edge, which results in an edge-high etch rate profile, i.e., an increased etch rate at the edge of the substrate compared to regions disposed radially inward therefrom. On the other hand, when the edge ring temperature is relatively high (FIG. 4E), less polymer deposition will occur on the edge ring 123 and there is higher polymerizing species concentration near the substrate edge. Thus, comparatively more polymer deposits on the substrate edge result in an edge-slow etch rate profile, i.e., a decreased etch rate at the edge of the substrate compared to regions disposed radially inward therefrom.

In other embodiments, the high bias power applied on the edge ring can function in part as the elevated edge ring temperature to reduce polymer deposition on the edge ring, thus increasing polymerizing species concentration above the substrate edge. In other embodiments, the bias power applied on the edge ring can be a tuning knob to increase or decrease the sensitivity of the process near the substrate edge to the edge ring temperature.

Figure 5A:
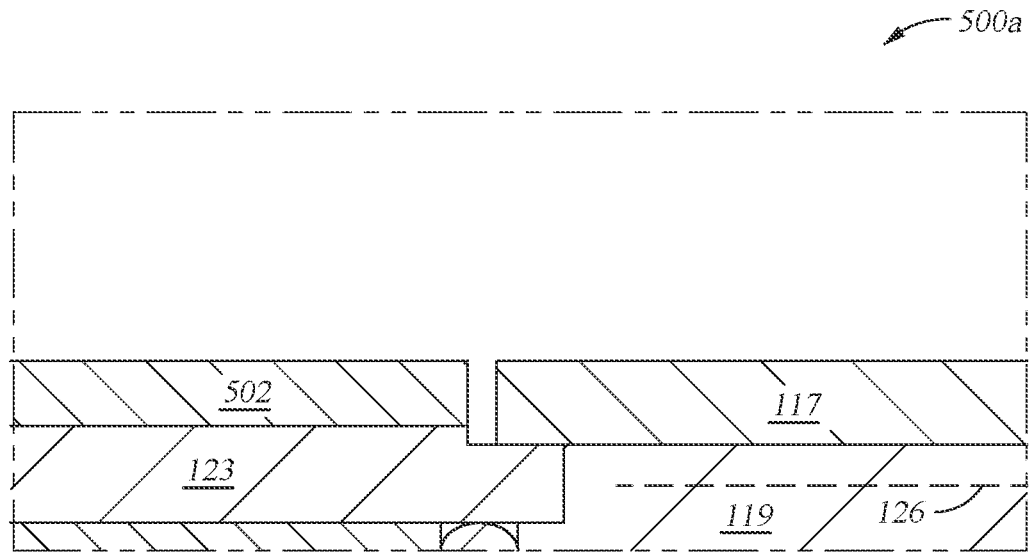
FIG. 5A is a schematic cross-sectional view of a portion of a substrate support assembly, according to another embodiment, which may be used in the processing chamber described in FIG. 1.
Figure 5B:
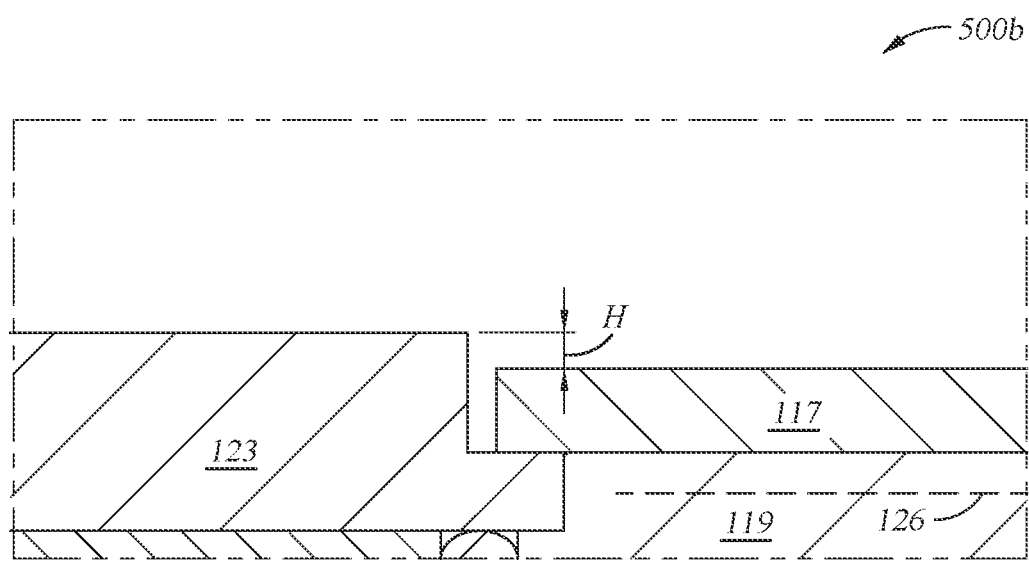
FIG. 5B is a schematic cross-sectional view of a portion of a substrate support assembly, according to another embodiment, which may be used in the processing chamber described in FIG. 1.

FIGS. 5A and 5B are schematic cross-sectional views of a portion of a substrate support assembly according to some embodiments, which may be combined with one or a combination of other embodiments of the substrate support assemblies described herein. In FIG. 5A, the substrate support assembly 500a may be any one of the substrate support assemblies shown in FIGS. 1-4 or set forth in the descriptions thereof and further includes an electrically insulating ring 502 made of a dielectric material, such as a quartz or a metal oxide ceramic, disposed on the edge ring 123. Typically, the plasma-facing surface of the electrically insulating ring 502 will have a lower etch rate than the plasma-facing surface of the edge ring 123 (when the electrically insulating ring 502 is not disposed thereon) and thus will desirably extend the substrate processing lifetime of the substrate support assembly 500a. In other embodiments, the electrically insulating ring 502 is formed of a material that is less likely to generate particles in the chamber for the sake of defect control.

FIG. 5B is a schematic cross-sectional view of a portion of a substrate support assembly, according to another embodiment, which may be used in the processing chamber described in FIG. 1. In FIG. 5B, the substrate support assembly 500b may be any one of or comprise any combination of the features of the substrate support assemblies shown and described in FIGS. 1-3. Here, the edge ring 123 extends above a plane of the plasma-facing surface of the substrate by a height H, i.e., the plasma-facing surface of the edge ring 123 stands taller than the plasma-facing surface of the substrate 117. Typically, if the processing conditions and biasing conditions are the same, the thickness of the sheath disposed above the edge ring will be the same. Assuming the processing conditions and biasing conditions shown in FIG. 4A, extending the plasma-facing surface of the edge ring 123 above the plane of the plasma-facing surface of the substrate 117 will also push the sheath upwards to create a plasma profile resembling the plasma profile of FIG. 4B. Thus, extending the plasma-facing surface of the edge ring 123 above the plane of the plasma-facing surface of the substrate 117 will allow for the formation of the plasma profile of FIG. 4B at relativity reduced edge ring biasing power when compared to a coplanar biasing ring and substrate surface configuration. In other embodiments, the edge ring 123 will be recessed from a plane of the surface of the substrate and, for the same processing conditions described in FIG. 4A, the resulting plasma profile will more closely resemble the plasma profile of FIG. 4C.

Figure 6A:
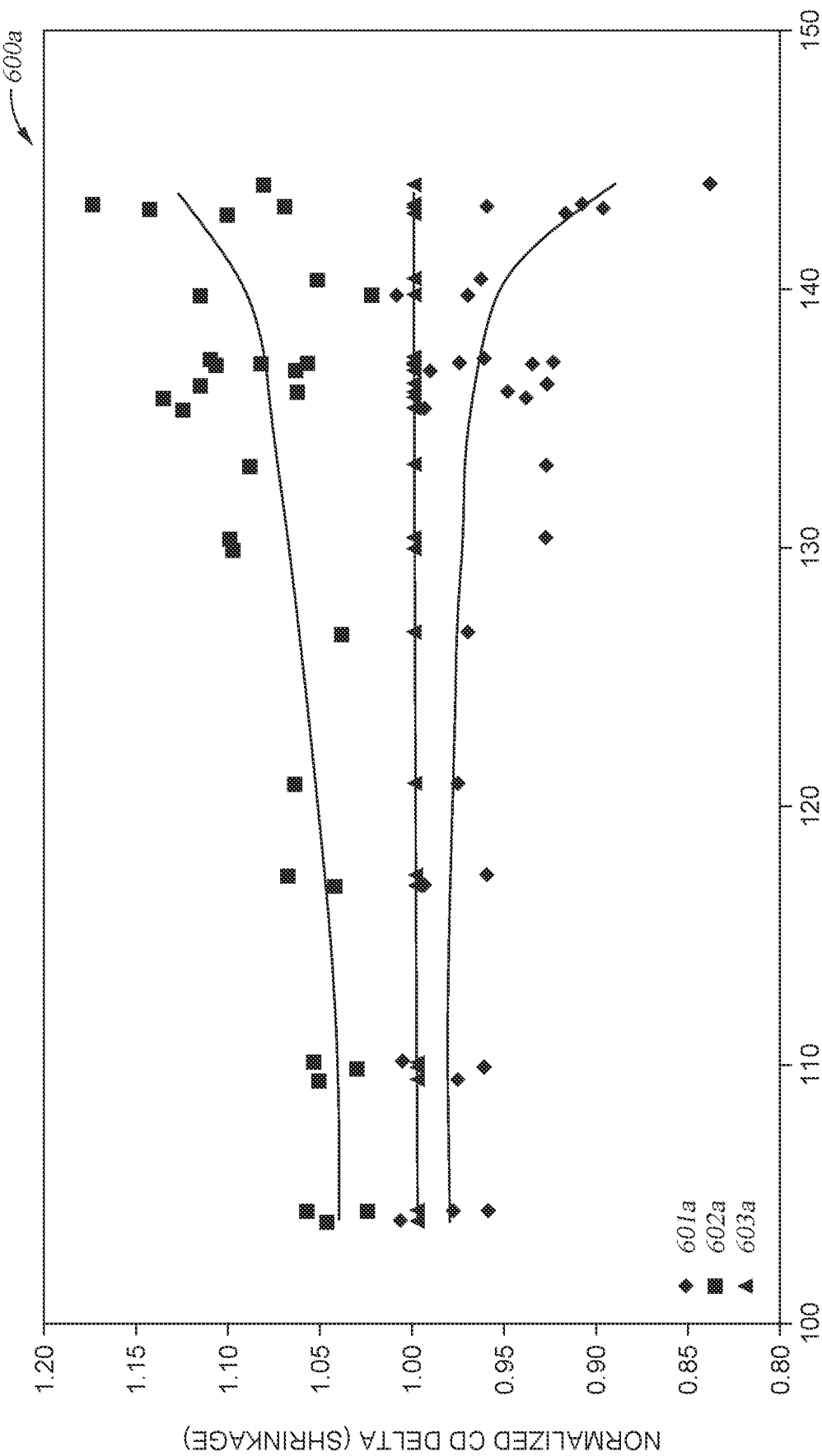
FIGS. 6A-6B show comparative measurements of normalized critical dimension (CD) shrinkage proximate to the edges of substrates processed using embodiments of the methods set forth herein.
Figure 6B:
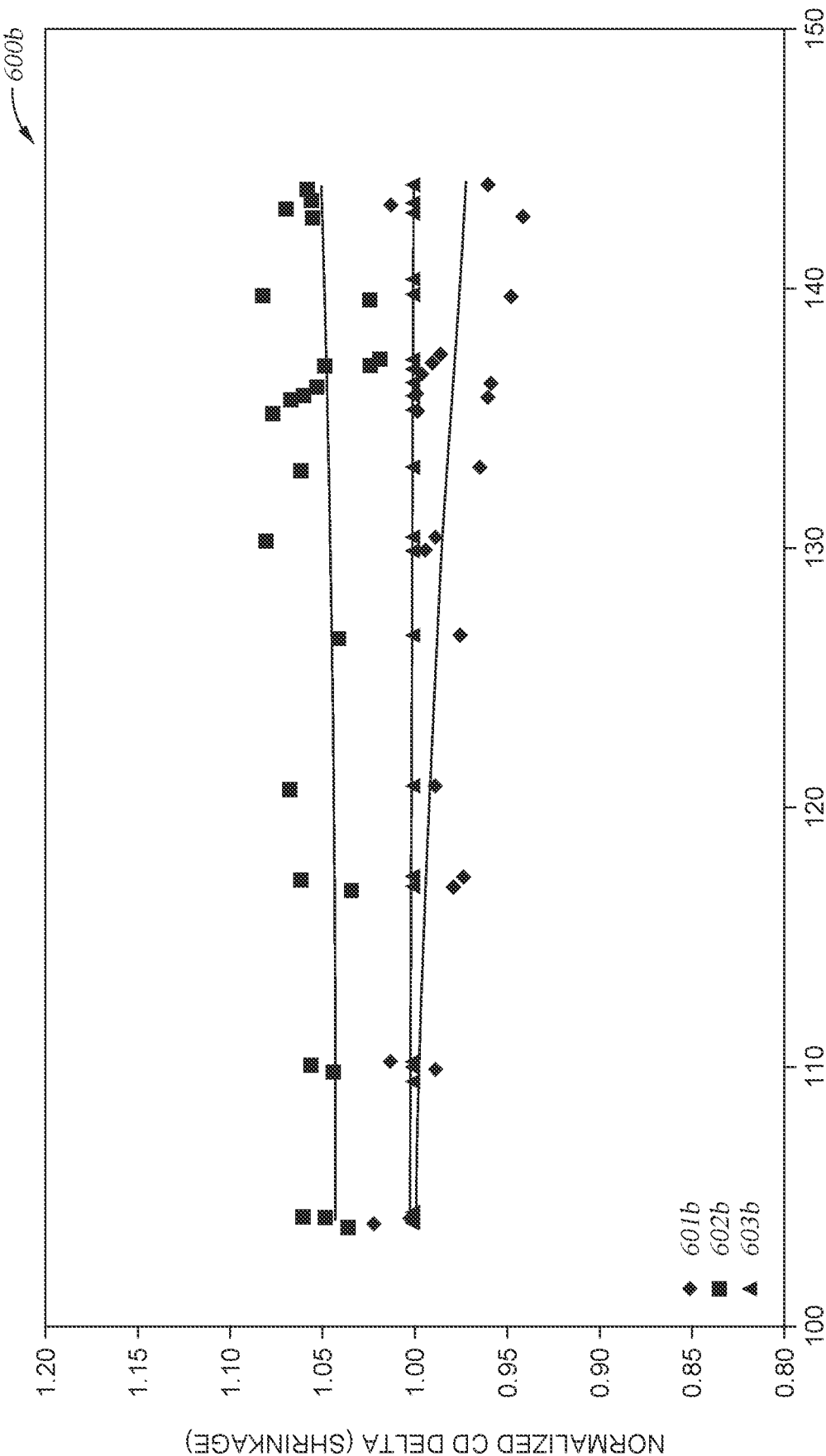

Charts 600a-b of FIGS. 6A-6B, respectively, show comparative measurements of normalized critical dimension (CD) shrinkage proximate to the edges of substrates processed using embodiments of the methods set forth herein. Charts 700a-b of FIGS. 7A-7B, respectively, show comparative measurements of normalized etch rate proximate to the edges of substrates processed using the same processing conditions set forth respectively in FIGS. 6A-6B.

CD shrinkage enables the patterning of openings in the surface of a substrate where the openings have a dimension, which is less than a lithography-defined dimension in a photoresist layer disposed there above. Typically, the photoresist layer is formed on a multi-layer mask disposed on the to be etched surface of the substrate to be processed. Openings in the photoresist layer and multi-layer mask are formed by forming a plasma of a processing gas comprising an etchant and a polymerizing gas and exposing a substrate, having the multi-layer mask and the photoresist layer formed thereon, to the plasma. The polymerizing gas forms a polymerized passivation layer on the sidewalls of the openings being etched into the multi-layer stack to decrease the CD of the etched features as they are formed therein. Thus, the dimensions of the openings formed in the surface of the substrate are reduced and thus shrunk when compared to the lithography-defined dimensions patterned in the photoresist layer. Typically, the polymerized passivation layer forms faster on a relatively colder surface than that on a warmer surface due to a higher sticking coefficient, and thus absorption, of the polymerizing species on the colder surface.

In FIGS. 6A-6B and 7A-7B, each of the substrates was processed by forming a plasma of an etchant gas and a polymerizing gas, biasing the substrate, and exposing the substrate to the plasma. Here, the etchant and polymerizing gas included $CHF_3$ at a flowrate of 100 sccm, $CF_4$ at 50 sccm, $N_2$ at 100 sccm, Ar at 100 sccm. The substrates were biased using a biasing power of 0.14 $W/cm^2$ of substrate surface area, and the edge ring bias was varied between about 10 W and about 60 W. Each of the substrates processed had a radius of 150 mm. CD shrinkage, shown in FIGS. 6A-6B, was measured at a plurality of radial locations disposed between about 105 mm and about 145 mm from the center of the substrate. An etch rate example, shown in FIGS. 7A-7B, was measured at a plurality of radial locations disposed between about 100 mm and about 150 mm from the center of the substrate.

In FIG. 6A, the edge ring was biased using a lower bias voltage than the bias voltage applied to the edge ring in FIG. 6B. In FIGS. 6A and 6B, respectively, substrates 601a-b, 602a-b, and 603a-b were processed using edge rings maintained at three different temperatures relative to the temperature of a substrate support having the substrate disposed thereon. For substrates 601a,b, the temperature of the edge ring was maintained at about 30° C. less than the temperature of the substrate support to provide a temperature differential of Δ−30° C. therebetween. For substrates 602a,b, the temperature of the edge ring was maintained at about 40° C. more than the temperature of the substrate support to provide a temperature differential of Δ+40° C. therebetween. For substrates 603a,b, the edge ring temperature was maintained at about the same temperature as the substrate support to provide a temperature differential of Δ 0° C. therebetween.

In both FIGS. 6A and 6B, decreasing the temperature of the edge ring relative to the substrate 601a,b reduces CD shrinkage at the edge of the substrate compared to CD shrinkage measured at sites disposed radially inward therefrom. In both FIGS. 6A and 6B, increasing the temperature of the edge ring relative to the substrates 602a,b increases CD shrinkage at the edge of the substrate compared to CD shrinkage measured at sites disposed radially inward therefrom. As shown in FIGS. 6A and 6B, tuning the edge ring temperature is an effective tuning knob to tune the CD profile at the edge of the substrate.

Notably, the effect of varying the edge ring temperature has a more pronounced effect on both reducing and increasing CD shrinkage at the edge of the substrate when the edge ring is biased using a relatively lower bias voltage, as shown in FIG. 6A, than when the edge ring is biased using the higher edge ring bias voltage, as shown in FIG. 6B. This suggests that controlled biasing of the edge ring can enlarge or reduce the temperature turning effect of the edge ring by controlling the thickness of the plasma sheath formed there above.

Figure 7A:
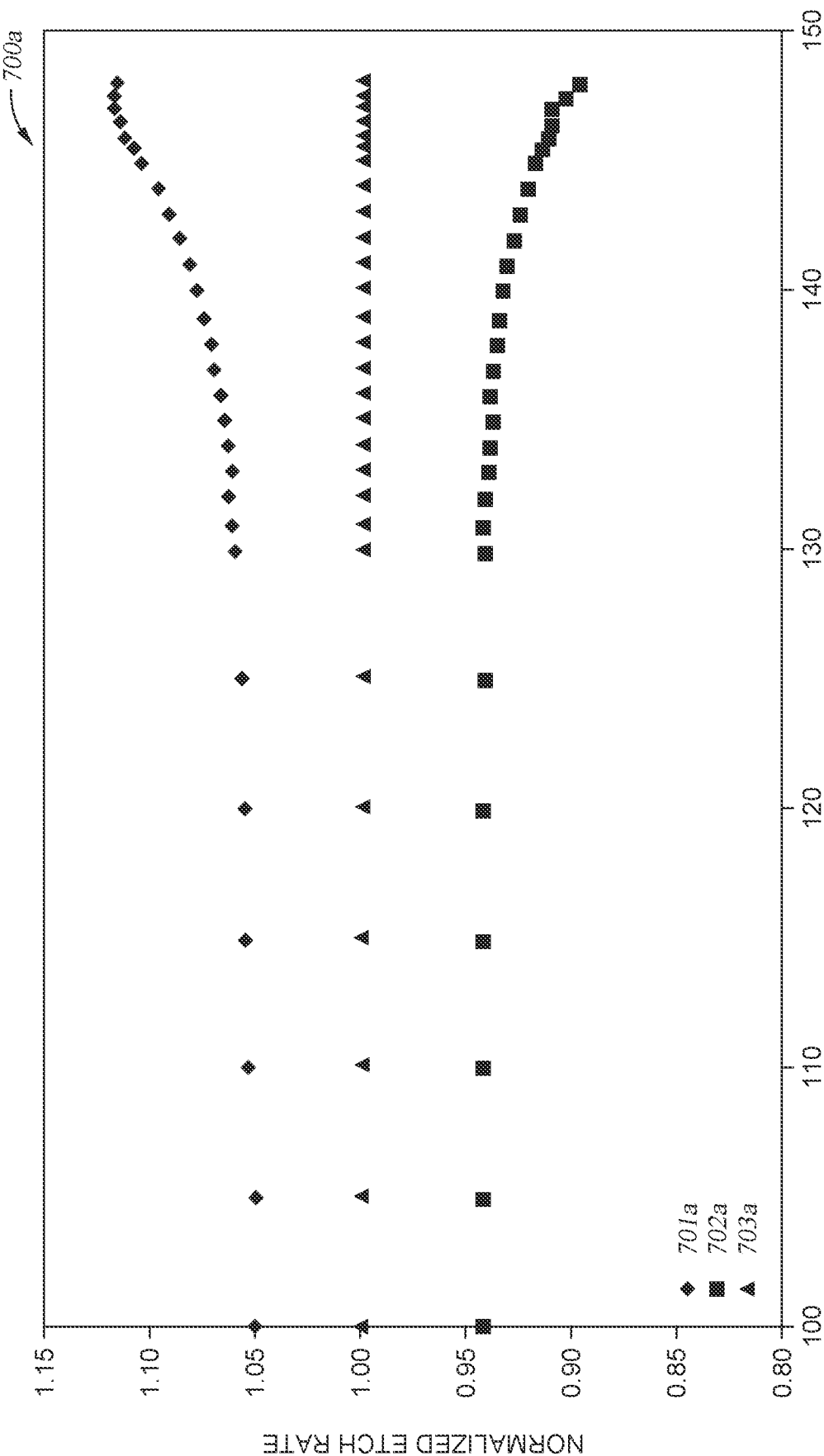
FIGS. 7A-7B show comparative measurements of normalized etch rate proximate to the edges of substrates processed using the same processing conditions set forth respectively in FIGS. 6A-6B.
Figure 7B:
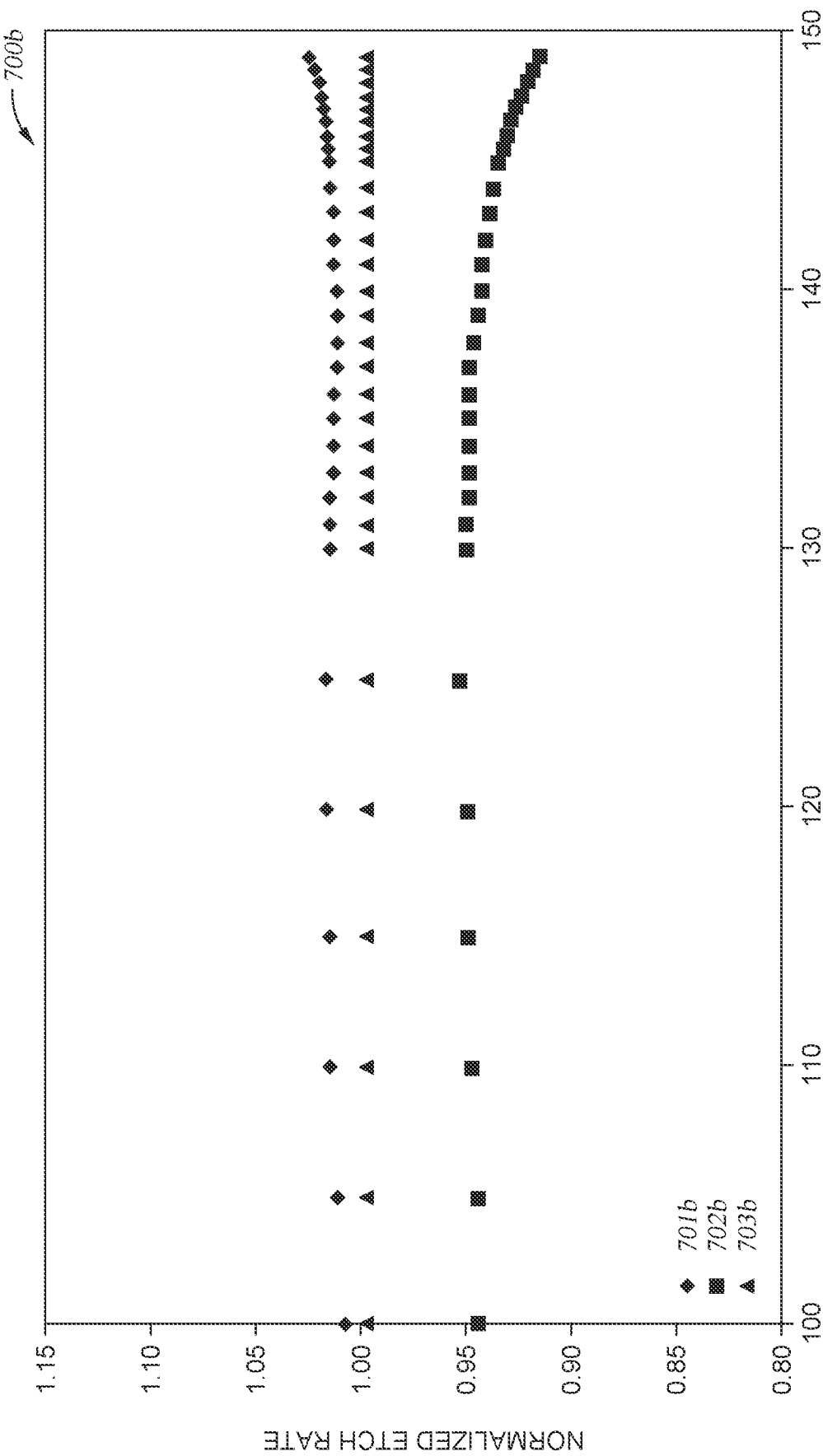

FIGS. 7A-7B show comparative measurements of the etch rate example, proximate to the edge of a substrate processed using embodiments of the methods set forth herein. In FIG. 7A, the edge ring was biased using a lower bias voltage than the bias voltage applied to the edge ring in FIG. 7B. Here, the substrates 701a-b, 702a-b, and 703a-b were processed using the same processing conditions, respectively set forth for the substrates 601a-b, 602a-b, and 603a-b of FIGS. 6A and 6B. For substrates 701a, b, the temperature of the edge ring was maintained at about 30° C. less than the temperature of the substrate support to provide a temperature differential of Δ−30° C. therebetween. For substrates 702a,b the temperature of the edge ring was maintained at about 40° C. more than the temperature of the substrate support to provide a temperature differential of Δ+40° C. therebetween. For substrates 703a, b, the edge ring temperature was maintained at about the same temperature as the substrate support to provide a temperature differential of Δ 0° C. therebetween.

In both FIGS. 7A and 7B, decreasing the temperature of the edge ring relative to the temperature of the substrates 601a,b generally increases the etch rate measured at the edge of the substrate compared to etch rates measured radially inward therefrom. In both FIGS. 7A and 7B, increasing the temperature of the edge ring relative to the temperature of the substrates 702a,b decreased the etch rate measured at the edge of the substrate compared to etch rates measured radially inward therefrom.

Similar to the CD shrinkage measurements set forth in FIGS. 6A and 6B, the effect of varying the edge ring temperature is more pronounced in both reducing and increasing the etch rate towards the edge of the substrate when the edge ring is biased using a relatively lower bias voltage, as shown in FIG. 7A, than when the edge ring is biased using the higher edge ring bias voltage, as shown in FIG. 7B. This again suggests that controlled biasing of the edge ring can enlarge or reduce the temperature turning effect of the edge ring by controlling the thickness of the plasma sheath formed there above.

Figure 8:
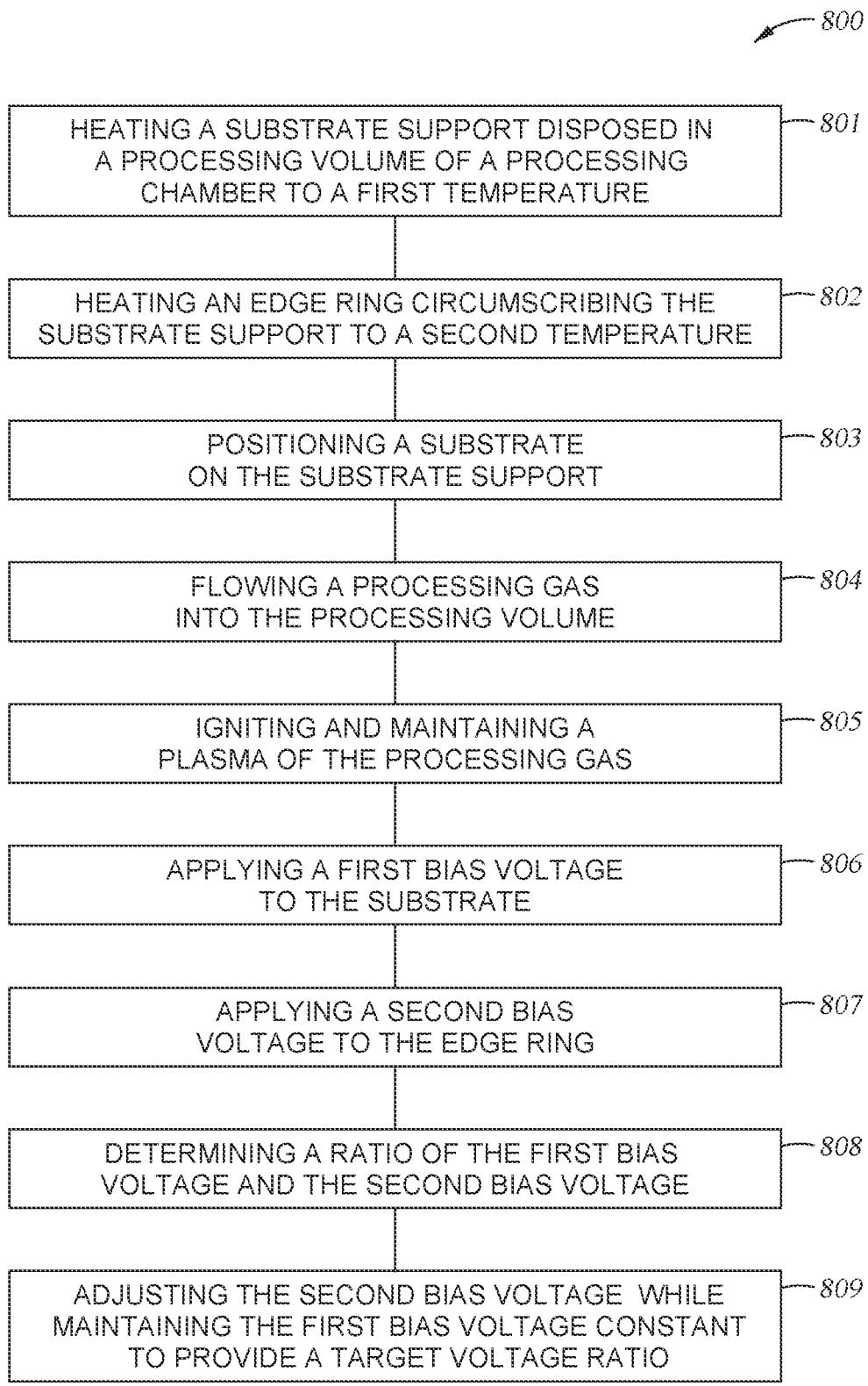
FIG. 8 is a flow diagram setting forth a method of processing a substrate according to embodiments described herein.

FIG. 8 is a flow diagram setting forth a method 800 of processing a substrate using a substrate support assembly configured according to embodiments described herein. At activity 801, the method includes positioning a substrate on a substrate support assembly disposed in a processing volume of a processing chamber, such as the processing chamber described in FIG. 1. Here, the substrate support assembly features a first base plate and a second base plate circumscribing the first base plate. Each of the first and second base plates includes one or more first and second channels respectively disposed therein. The substrate support assembly further includes a substrate support disposed on and thermally coupled to the first base plate, and a biasing ring disposed on and thermally coupled to the second base plate. Here the substrate support and the biasing ring are each formed of a dielectric material. The biasing ring further includes an edge ring biasing electrode embedded in the dielectric material of the biasing ring and an edge ring disposed on the biasing ring.

At activities 802 and 803, the method 800 includes respectively heating the substrate to a first temperature and heating an edge ring circumscribing the substrate to a second temperature. Typically, the substrate support, and thus the substrate disposed thereon, is heated to the first temperature using a first heater disposed between the substrate support and the first base plate or embedded in the dielectric material of the substrate support. The biasing ring, and thus the edge ring disposed thereon, is heated to the second temperature using a second heater disposed between the biasing ring and the second base plate or embedded in the dielectric material of the biasing ring. In some embodiments, the method 800 further includes maintaining the substrate at a desired temperature or within a desired range of temperatures and maintaining the edge ring at a desired temperature or within a desired range of temperatures. Here, the temperatures of the edge ring and substrate support are controlled independently from one another. Controlling the edge ring temperature enables tuning of the polymerizing species concentration near the edge ring and proximate to the edge of the substrate within the plasma, thus tuning the process profile.

At activities 804 and 805, the method 800 respectively includes flowing a processing gas into the processing volume of a processing chamber and igniting and maintaining a plasma of the processing gas.

At activities 806 and 807, the method 800 respectively includes biasing the substrate using a first bias voltage and biasing the edge ring using a second bias voltage. Here, biasing the substrate includes applying the first bias voltage to one of the first base plate, a chucking electrode embedded in the dielectric material of the substrate support, or a biasing electrode embedded in the dielectric material of the substrate support. Biasing the edge ring includes applying the second bias voltage to an edge ring biasing electrode embedded in the dielectric material of the biasing ring.

At activity 808, the method 800 includes determining a ratio of the first bias voltage and the second bias voltage. At activity 809, the method 800 includes adjusting the second bias voltage to achieve a target voltage ratio. In some embodiments, the first bias voltage is maintained at a constant voltage while the second bias voltage is adjusted to achieve the target voltage ratio.

The methods described herein beneficially allow for fine control and tuning of plasma properties in regions disposed above and proximate to the edge of the substrate being processed. Fine control and tuning of the plasma properties allows for fine control and tuning of processing result profiles at the substrate edge. Benefits of embodiments herein further include eliminating or substantially reducing substrate to substrate processing variation otherwise attributable to a steady rise in the temperature of an edge ring not having temperature control after the processing chamber has been sitting idle, e.g., first wafer effect.

While the foregoing is directed to embodiments of the present disclosure, other and further embodiments of the disclosure may be devised without departing from the basic scope thereof, and the scope thereof is determined by the claims that follow.

The invention claimed is:

1. A substrate processing system, comprising:
a substrate support assembly, comprising:
   a base plate;
   a first bias electrode disposed over the base plate and spaced apart from the base plate by a first portion of dielectric material;
   a second portion of dielectric material disposed over the first bias electrode, the second portion of dielectric material forming a substrate supporting surface;
   a second bias electrode disposed a distance from a center of the substrate supporting surface and spaced apart from the first bias electrode by a third portion of dielectric material;
   a pulsed DC bias system configured to deliver a first pulsed DC voltage to the first bias electrode and a second pulsed DC voltage to the second bias electrode, the pulsed DC bias system comprising a first pulsed DC power supply that is electrically coupled to the first bias electrode; and
   a chucking power supply electrically coupled to the first bias electrode, the chucking power supply configured to provide a DC chucking voltage for electrically clamping a substrate to the substrate supporting surface.

2. The substrate processing system of claim 1, wherein the second bias electrode is spaced apart from a plasma-facing surface of the substrate support assembly by a fourth portion of dielectric material disposed therebetween.

3. The substrate processing system of claim 1, wherein the second bias electrode is electrically coupled to a second pulsed DC power supply.

4. The substrate processing system of claim 1, further comprising an edge ring disposed over the second bias electrode, the edge ring surrounding the substrate supporting surface.

5. The substrate processing system of claim 1, wherein the second bias electrode is electrically coupled to the first pulsed DC power supply.

6. The substrate processing system of claim 5, further comprising a tuning circuit configured to adjust the second pulsed DC voltage relative to the first pulsed DC voltage.

7. The substrate processing system of claim 1, further comprising a non-transitory computer-readable medium having instructions stored thereon for performing a method of processing a substrate when executed by a processor, the method comprising:
   (a) igniting and maintaining a plasma in a processing volume of a processing chamber, the processing volume having the substrate support assembly disposed therein;
   (b) applying a chucking voltage to the first bias electrode to electrically clamp the substrate to the substrate supporting surface;
   (c) applying the first pulsed DC voltage to the first bias electrode; and
   (d) applying the second pulsed DC voltage to the second bias electrode.

8. The substrate processing system of claim 7, wherein the method further comprises:
   (e) adjusting the second pulsed DC voltage relative to the first pulsed DC voltage.

9. The substrate processing system of claim 7, further comprising:
   a chamber lid, one or more chamber walls, and a chamber base which collectively define the processing volume, wherein a plurality of electrodes are disposed in the processing volume, the plurality of electrodes comprising the base plate, the first bias electrode, and the second bias electrode; and
   an RF power supply electrically coupled to one of the plurality of electrodes which is configured to ignite and maintain the plasma through capacitive coupling therewith.

10. A substrate processing system, comprising:
a chamber lid, one or more chamber walls, and a chamber base which collectively define a processing volume,
a plurality of electrodes disposed in the processing volume, the plurality of electrodes comprising a base plate, a first bias electrode, and a second bias electrode;
a substrate support assembly, comprising:
   the base plate;
   the first bias electrode disposed over the base plate and spaced apart from the base plate by a first portion of dielectric material;
   a second portion of dielectric material disposed over the first bias electrode, the second portion of dielectric material forming a substrate supporting surface;
   the second bias electrode disposed a distance from a center of the substrate supporting surface and spaced apart from the first bias electrode by a third portion of dielectric material; and
   an edge ring, disposed over the second bias electrode to surround the substrate supporting surface; and
a non-transitory computer-readable medium having instructions stored thereon for performing a method of processing a substrate when executed by a processor, the method comprising:
   (a) igniting and maintaining a plasma in the processing volume;
   (b) applying a chucking voltage to the first bias electrode to electrically clamp a substrate to the substrate supporting surface;
   (c) applying a first pulsed DC voltage to the first bias electrode;
   (d) applying a second pulsed DC voltage to the second bias electrode; and
   (e) adjusting the second pulsed DC voltage relative to the first pulsed DC voltage.

11. The substrate processing system of claim 10, wherein
the first bias electrode and the second bias electrode are each electrically coupled to a first pulsed DC power supply, and
the second pulsed DC voltage is adjusted relative to the first pulsed DC voltage by use of a tuning circuit.

12. The substrate processing system of claim 10, wherein
the first bias electrode is electrically coupled to a first pulsed DC power supply,
the second bias electrode is electrically coupled to a second DC power supply, and
the second DC power supply is independently operable from the first pulsed DC power supply.

* * * * *